United States Patent [19]
Vodjdani et al.

[11] Patent Number: 5,311,221
[45] Date of Patent: May 10, 1994

[54] ELECTROMAGNETIC WAVE MODULATOR EQUIPPED WITH COUPLED QUANTAL WELLS, AND APPLICATION TO AN ELECTROMAGNETIC WAVE DETECTOR

[75] Inventors: Nakita Vodjdani; Claude Weisbuch; Borge Vinter; Julien Nagle, all of Paris; Michel Papuchon, Massy; Jean-Paul Pocholle, Arpajon; Dominique Delacourt, Paris, all of France

[73] Assignee: Thomson CSF, Puteaux, France

[21] Appl. No.: 364,680

[22] Filed: May 11, 1989

[30] Foreign Application Priority Data
May 11, 1988 [FR] France .................. 88 06346

[51] Int. Cl.$^5$ .............. G02B 6/10; G02B 5/14; H01L 33/00
[52] U.S. Cl. ...................... 359/130; 257/43; 359/240
[58] Field of Search ............ 357/30; 455/610–612; 350/96.14, 353–355; 372/12

[56] References Cited
U.S. PATENT DOCUMENTS 4,525,687  6/1985  Chemla et al. .............. 357/16
4,737,003  4/1988  Matsumura et al. .......... 350/96.14
4,861,130  8/1989  Katsuyama et al. .......... 350/96.14

OTHER PUBLICATIONS

Erman et al; "III–IV Semiconductor Waveguides ..."; Integ. Opt. Circ. Eng. III, Apr. 18, 1986, vol. 651, pp. 78–82; abst. only.
Shortose et al; "Electric Field Dependent Exciton ..."; Proc. NATO Adv. Study Inst. Jul. 4, 1987, pp. 385–386; abst. only.
Chemla et al; "Nonlinear Optics and Electromagnetics ..."p Springer-Verlag, Apr. 5, 1986, pp. 289–302; abst. only.

Primary Examiner—Nelson Moskowitz
Attorney, Agent, or Firm—Cushman, Darby & Cushman

[57] ABSTRACT

A semi-conducting structure delimits two quantal wells (CP1, CP2) connected across a barrier layer (CB). The application of an electric field to the structure makes possible the transfer of electrons from one of the wells to the other. The electron-hole pairs are created by a wave-pump, or by the doping of one of the wells. This makes possible, in particular, a dual control by means of the wave-pump and the electric field, thus creating an "AND"-function modulator.

17 Claims, 8 Drawing Sheets

ELECTROMAGNETIC WAVE MODULATOR EQUIPPED WITH COUPLED QUANTAL WELLS, AND APPLICATION TO AN ELECTROMAGNETIC WAVE DETECTOR

BACKGROUND OF THE INVENTION

The invention concerns an electromagnetic wave modulator equipped with coupled quantal wells. The wave to be modulated may be propagated freely or it may be guided. The invention is applicable, in particular, to the modulation of infrared waves.

It is very difficult to produce modulators which, operating in the infrared region of the spectrum, function rapidly and, at the same time, possess an great depth of modulation.

Some modulators employ injection in a semi-conducting free-carrier structure. However, the transmission band of these modulators is limited by their fairly long recombination time, which may be the result of a radiative and/or non-radiative interaction.

Pockels-effect modulators are also well known. These devices use the change in the index of refraction of the semi-conducting material under the effect of an electrical field. They are, therefore, "electrooptical" modulators. Their index variation is, however, very low, resulting in the fact that, to obtain a significant effect, use must be made of devices which have a considerable length of interaction, and which are, therefore, very large. Although the electrooptical effect is quite fast, since its characteristics times are on the order of several femto-seconds, the desire to obtain a significant depth of modulation will dictate that the size of the device condition the transmission band of the modulator. Furthermore, this is especially critical in the infrared range (in relation to the visible and near-infrared ranges) because the size of the modulator must also increase as the wavelength increases.

Other well-known modulators use the principle of electroabsorption (Franz-Keldysh effect). In this case, an electric control field is applied which, when substantially raised, shifts the absorption threshold of the material (in terms of frequency). In this latter type of modulator, use must be made of semi-conducting materials possessing a forbidden-band energy very close to the energy of the band to be modulated. For example, in the case of an infrared wave having a wavelength of 10 micrometers, materials alloys II-II of Mendeleev's table are used. However, the industrial working of these materials is difficult to master and, given their slight forbidden-band energy gap, they are very sensitive to manufacturing imperfections.

For this reason, other solutions have been proposed, according to which intra-band absorption between, for example, two discrete levels of a quantal well is used. The manufacture of semi-conducting materials used to delimit these quantal wells is much more effectively achieved when III-V semi-conductors from Mendeleev's table are used.

In such a structure, the means of control of the modulation is based on a wave-pump whose amplitude is modulated and which possesses a frequency greater than that of the wave to be modulated. The wave-pump serves to occupy a discrete level of the quantal well. The absorption of the wave to be modulated thus takes place by means of a transition from the electrons (or holes) of this first discrete level of the quantal well to another discrete level. In this way, control is effected over the absorption of a wave whose frequency is equal to the difference between the energies of the two discrete levels divided by Planck's constant.

More precisely, and as shown in FIG. 1, a modulator of this kind may incorporate a structure having a quantal well (1, 2, 3) whose optical characteristics are modified by an optical pumping achieved by means of a control wave (h.$\nu$1) belonging to the middle infrared band. The command wave h.$\nu$1 is modulated by means of a conventional modulator. By modulating the amplitude of the control wave h.$\nu$1, it is possible to modulate the amplitude or the phase of the wave to be modulated h.$\nu$3.

Although they are very advantageous for certain applications, these modulators have, however, a residual disadvantage: it is impossible to optimize them so as to obtain both a large transmission band and a significant depth of modulation.

In fact, the transmission band of these modulators is limited either by the transmission band of the wave-pump, or by the recombination of the photo-created carriers at the first discrete energy level of the quantal well. In order to restrict these disadvantageous effects to that of the limitation resulting from the transmission band of the wave-pump, short life-spans of the carriers is desirable. In this case, however, for a given wave-pump power, the shorter the life-span of the carriers, the shallower the depth of modulation. It appears, therefore, ultimately that today, it has not yet been possible to obtain optical modulators which are completely satisfactory, especially when dealing with infrared light.

A first purpose of the invention consists in supplying an optical modulator in which a spatial separation of electrons and of holes in two different quantal wells has been achieved, thus making it possible to increase the life of the electron-hole pairs. This makes it, therefore, possible to reduce the power of the wave-pump required for a given intra-band absorption.

Another purpose of the invention is to make available a modulator which may be transparent, or, on the contrary, opaque in normal operation for the electromagnetic wave to be modulated.

A third purpose of the invention is the creation of a modulator which may be controlled by the electric field. Finally, since the modulator can also be controlled by the coexistence of a wave-pump and an electric field, it may be used as an AND element or in applications of the "image-recognition" type.

SUMMARY OF THE INVENTION

The proposed modulator is of the kind incorporating:
a semi-conducting structure containing alternating layers making up a first quantal well;
means for populating the first discrete energy level of the quantal well with electrons; and
means for controlling the absorption of a wave to be modulated by the quantal well.

In accordance with a general description of the invention, the semi-conducting structure has another series of alternating layers in proximity to the first, which makes up a second quantal well coupled to the first quantal well through a barrier layer, which is slender enough to ensure a strong coupling; furthermore, the means of control incorporate means for the creation of an electric field, perpendicular to said barrier, on the structure when the control is given, thereby making possible the increase of life-span of the electron-hole pairs created.

In a first group of modulators which provides particularly advantage, the modulator is made distinctive further by the fact that the wave to be modulated is subjected to intraband absorption, i.e., the wave is created between a first and second level of energy located on the same side of the forbidden band of one of the quantal wells.

In one subdivision of modulators, the second quantal well possesses a forbidden-band energy gap which is greater than that of the first well.

In a more specific embodiment which conforms to this subdivision, the means for excitation create a wave-pump on the semi-conducting structure; this wave-pump is capable of populating a first level of energy of the first quantal well with electron-hole pairs, while the application of the electric field transfers electrons form the first quantal well to the second, while said intraband absorption takes place in the second quantal well.

One especially interesting aspect of the invention thus lies in the fact that the means of excitation may be made active on command. This makes possible an "AND" control function, as well as image-recognition operations.

In another sub-family of modulators, one of the quantal wells is doped. Excitation occurs by means of the application of an electric field which transfers electrons from one of the quantal wells to the other, in this latter of which the above-mentioned intraband absorption takes place.

If the doped well is the first, the modulator is normally transparent for the wave to be modulated. In the contrary case, in which the second well is doped, the modulator is normally opaque for the wave to be modulated. In either case, the modulator may, furthermore, incorporate ohmic contacts on the layers located on both sides of the quantal wells. The current thus captured enables the modulator to function as a light detector for the wave to be modulated.

In a second family of modulators, the wave to be modulated is subjected to interband absorption between two levels of energy situated on either side of the forbidden band of one of the quantal wells. In this case, it is also preferred that the second quantal well possesses a forbidden-band energy gap which is greater than that of the first.

Generally speaking, modulators according to the present invention may receive a free wave to be modulated or a guided wave, in accordance with one or two dimensions.

The pattern of two quantal wells, described above, may be repeated several times.

Finally, modulators according to the present invention may operate in the infrared range over virtually the entire band, especially for wave-lengths of 10 micrometers of more.

BRIEF DESCRIPTION OF THE DRAWINGS

Other characteristics and advantages of the invention will emerge from the study of the detailed description given below and of the attached drawings, in which.

DETAILED DESCRIPTION OF THE INVENTION

The attached drawings basically show components of a well-defined nature. Therefore, they are to be considered as incorporated into the present description and may not only serve to make this description better understood, but also contribute to the specification of the invention, as required.

Figure 1:
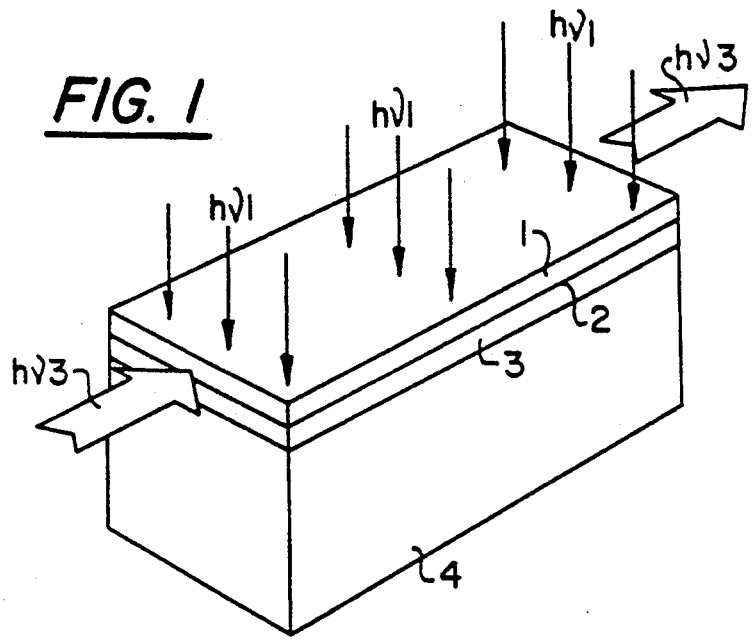
FIG. 1 is an embodiment of a modulator according to conventional art.
Figure 2:
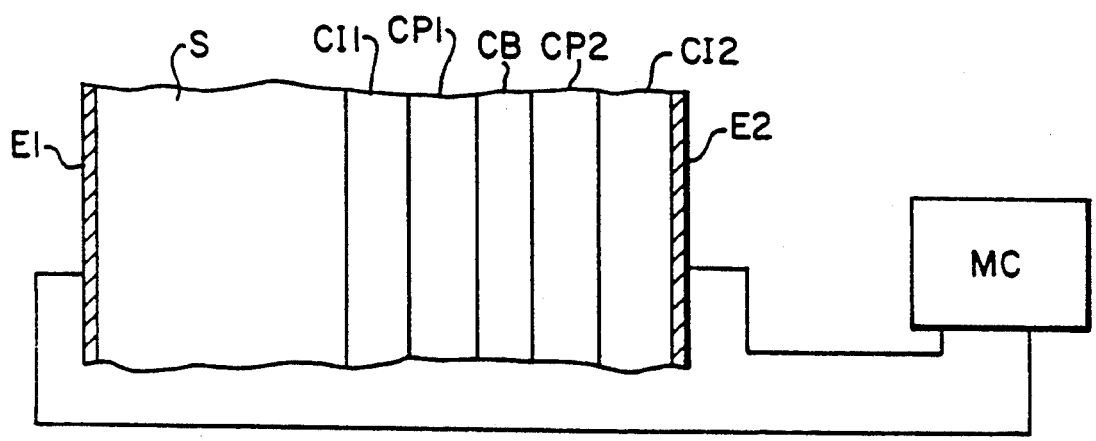
FIG. 2 is a skeleton diagram of a modulator according to the present invention.

In FIG. 2, a semi-conducting structure according to the invention is delimited by a semi-conducting substrate S, on which a intermediate layer CII is laid down by means of epitaxy; this layer is followed by an active layer CP1, a barrier layer CB, an active layer CP2, and an intermediate layer CI2.

The semi-conducting material used for the structure is, preferably, based on the semi-conductors found in columns III and V of Mendeleev's table or, on their alloys, especially alloys combining aluminum, gallium, or indium on the one hand, and phosphorus, arsenic, or antimony on the other. The alloys may be binary, ternary, or quaternary.

FIG. 2 illustrates two electrodes E1 and E2, located, for example, one on the accessible side of the substrate and the other on the last layer set opposite to it, which is here supposed to be the intermediate layer CI2. The application of voltage between the electrodes E1 and E2 using the means of control MC makes it possible to generate, upon command, an electric field perpendicular to the various layers, and in particular to the barrier layer CB.

The fashioning of structures incorporating quantal wells is, in general, well known. For this purpose, for example, the substrate is, or is not, doped. The first intermediary layer C!! has a composition which endows it with a strong forbidden-band energy gap (often called "gap" for short in English terminology). Here the abbreviation "forbidden-band gap" will be used. The CP1 layer, which will be used to delimit a first well, possesses to weak forbidden-band gap. The barrier layer CB possesses once again a strong forbidden-band gap. The second well layer CP2 has a medium or weak forbidden-band gap, according to the specific embodiment. The insulating layer CI2 has once again a strong forbidden-band gap. The thicknesses of the layers are of several tens of angstroms, typically about 50 angstroms. The thicknesses of the layers may be different, depending on the desired properties of the structure.

The barrier layer CB has a thickness which is slight compared with those of layers CI1 and CI2. It may be observed that their forbidden-band energies may be different (for CB, CI1, and CI2).

The structure shown in FIG. 2 may be taken as a pattern: the fundamental pattern is made up of the alternation of an intermediate layer CI1, of an well layer (CP1), of a barrier layer (CB), and of an well layer (CP2); this pattern is repeated along the epitaxial growth axis.

A structure of this kind will possess advantageous properties, from the moment when electron-hole pairs populating certain energy levels of one of the quantal wells are created for it.

Figure 3:
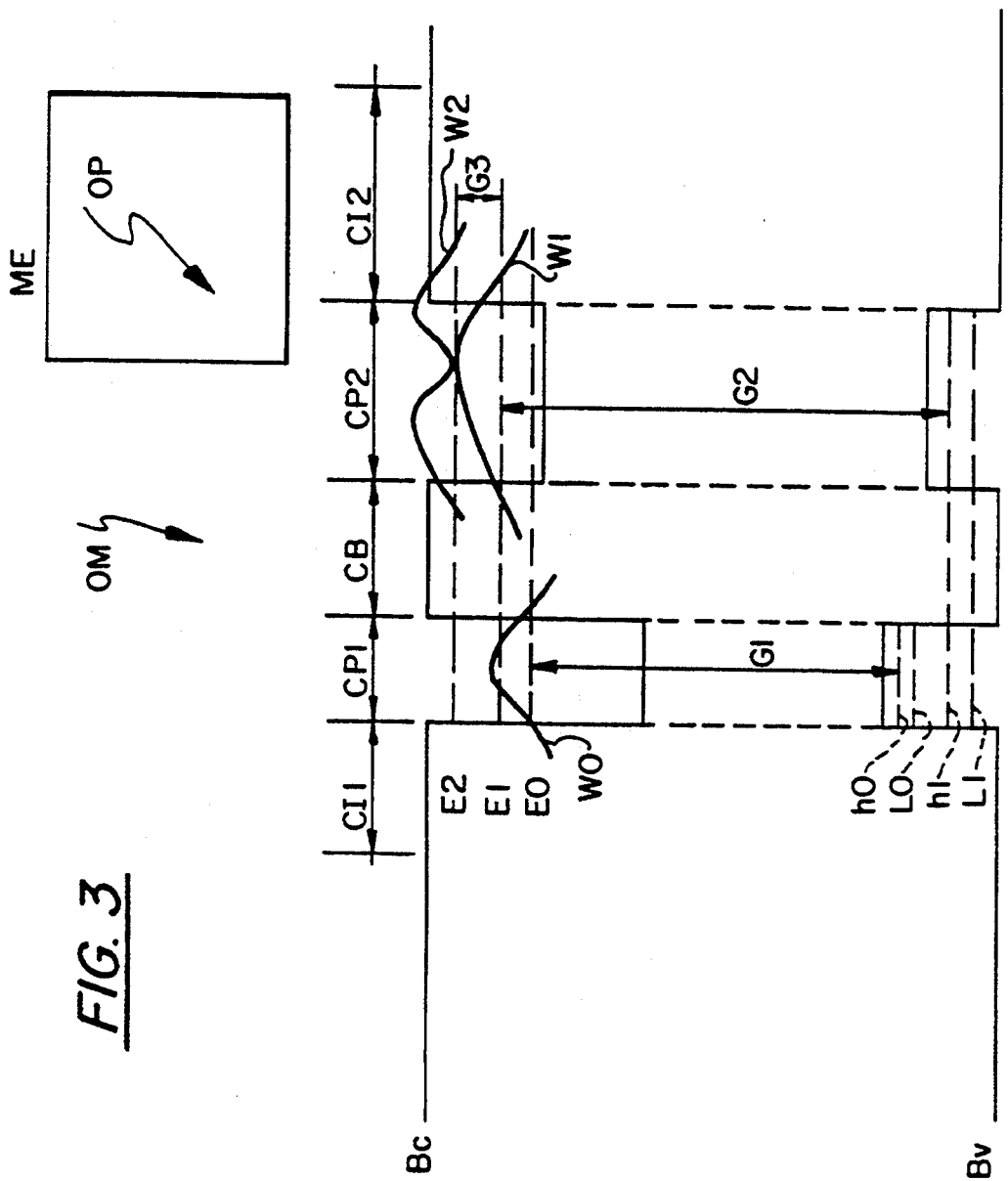
FIG. 3 is a schematic diagram of levels of energies which makes it possible to better understand the operation of a device according to the present invention.

FIG. 3 illustrates schematically the case in which the layers CP1 and CP2 possess different forbidden-band gaps.

The curves Bv and Bc designate, respectively, the upper limit of the valence band and the lower limit of the conduction band. The forbidden-band gap is delimited between these two curves.

Levels or energy available for the holes will be found beneath the curve Bv; among these holes, heavy (h) and light (L) are distinguished. The electrons will occur above the limit of the conduction band Bc.

Furthermore, electrons and holes (both heavy and light) may take on only certain discrete levels of energy.

With respect to holes, FIG. 3 shows the first level h0 for light holes, followed by other levels.

With respect to electrons, a first level of energy E0, followed by a second E1 and a third E2 are distinguished for both wells.

To each level of energy corresponds a wave function which designates the probability of the spatial presence of an electron or a hole for this level of energy. For example, the wave functions W0, W1, and W2 are shown diagrammatically in FIG. 3.

With respect to FIG. 3, it will be seen that W0 is located mainly in the first well, while W1 and W2 have a maximum probability of presence in the second well.

By studying FIG. 3, the specialist will observe that, in the well CP1, a minimal energy jump G1 may be delimited between the energy level h0 for heavy holes and the energy level E0 for electrons.

Similarly, in the well (CP2), a minimal energy jump G2 is located between the energy level h1 for the heavy holes and the energy level E1 for the corresponding electrons.

Finally, a third energy jump G3 may be delimited in a slightly different manner between the discrete level E1 and the discrete level E2 for the electrons.

The specific case illustrated in FIG. 3 shows the first family of modulators, in which intraband absorption will be used. More precisely, FIG. 3 illustrates the subfamily in which the gaps G1 and G2 are not the same for the two quantal wells, these not being intentionally doped.

Figure 7:
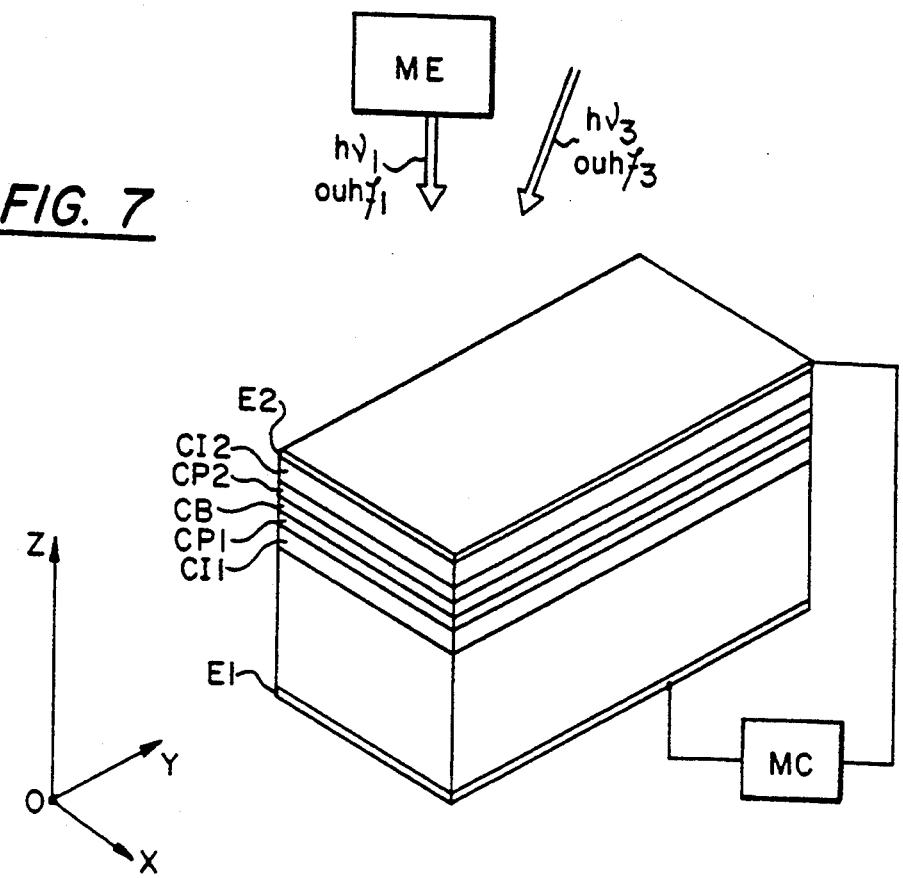
FIG. 7 illustrates an embodiment of the invention modulator.

FIG. 7 shows an embodiment of the modulator according to the invention.

It incorporates, on a substrate S, the following successive layers, whose growth occurred along the axis OZ of the reference mark OXYZ:
 a first intermediate layer CI1
 a first quantal well layer CP1
 a barrier layer CB
 a second quantal well layer CP2
 a second intermediate layer CI2.

Electrodes E1 and E2, connected to a voltage generator MC and arranged one on the lower surface of the substrate S and the other on the outer surface of the intermediate layer CI2, make it possible to generate an electric control field on the modulator.

Furthermore, a light source ME transmits a light wave having a frequency f1 linked to the length of the forbidden band G1 of the first quantal well by the equation $G1 \leq hf1$, where h is Planck's constant.

The first quantum well CP1 has only one quantal electron level, so that, in the absence of the generation of an electric field by electrodes E1 and E2, the modulator may be transparent to the wave to be modulated.

The modulator may also function by means of a first quantal well CP1 having two energy levels, and may be transparent to the wave to be modulated in the absence of an electric field; however, the difference between these two energy levels must not be equal to the difference of the energy levels of the second well, which corresponds to the wave to be modulated.

Here, the composition and size of the layers CP1 and CP2, which delimit the quantal wells, are, therefore, such that G1 is less than G2.

In the absence of an external electric field and of an energy wave-pump G1, the electronic levels E0, E1, and E2 are empty. The modulator is inactive, i.e., it cannot absorb the wave to be modulated OM.

When the structure is pumped using a wave having a frequency f1 such that $G1 \leq hf1 \leq G2$ (h=Planck's constant), the level E0 for the electrons and the level h0 for holes is occupied.

The frequency of the wave to be modulated is supposed to be equal to f3, such that $G3 = hf3$ where h is also Planck's constant.

Even in the presence of the wave-pump, there are no electrons in the well CP2. Thus, no absorption is possible at energy G3 corresponding to the wave to be modulated.

If, now, the command mechanism MC in FIG. 2 is actuated so as to generate an electric field longitudinal to the structure (i.e., perpendicular to the barrier layer CB), the levels E0 and E1 of the wells CP1 and CP2 may be "brought into resonance". In other words, the discrete energy levels of the well CP2 will be lowered in relation to those of well CP1. The electric field may thus be adjusted in such a way that the wave function of level E0 is localized in the well CP2, as shown in FIG. 6.

The result is the possibility of a transfer of electrons from well CP1 to well CP2. This transfer of electrons takes place by the tunnel effect through the barrier layer, as is well known in the technology.

Transitions between these two levels E1 and E2 using energy G3 become possible from the moment when the energy level E1 of the well CP2 becomes occupied. Light at the frequency f3 may now, therefore, be absorbed.

Figure 4:
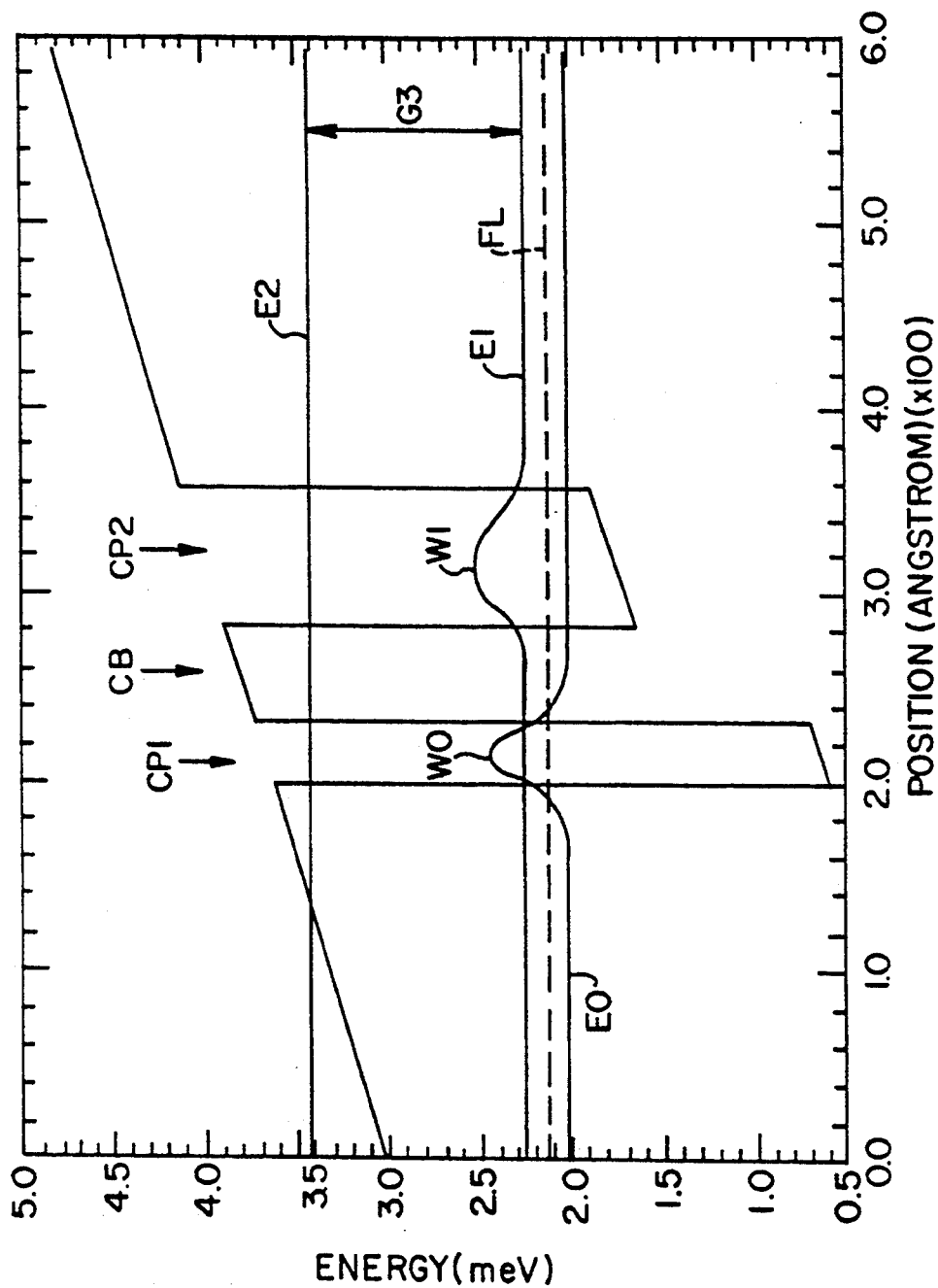
FIG. 4, 5, and 6 are energy and wave-function diagrams describing more precisely the operation of an embodiment of the device according to the present invention.
Figure 5:
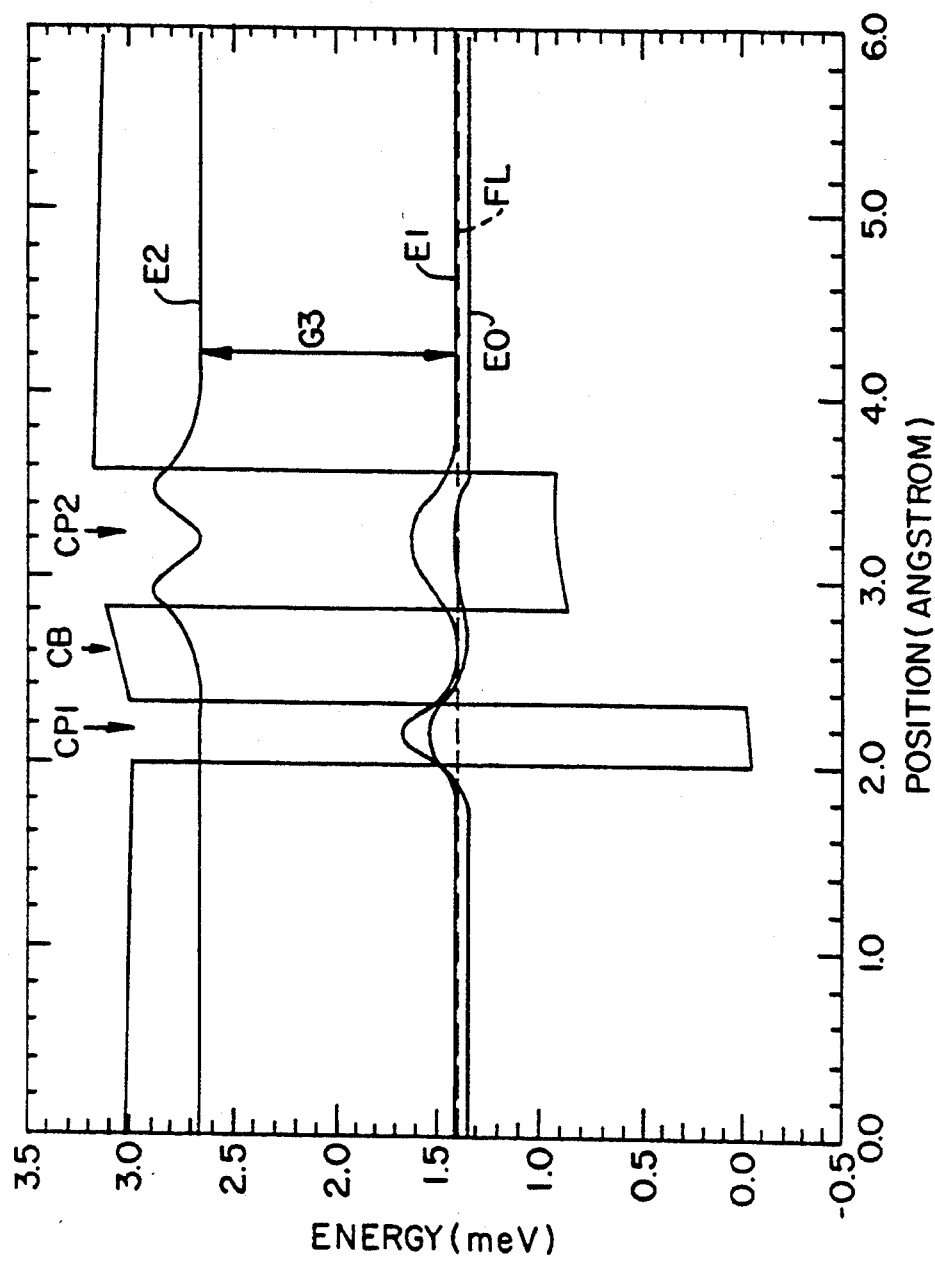
Figure 6:
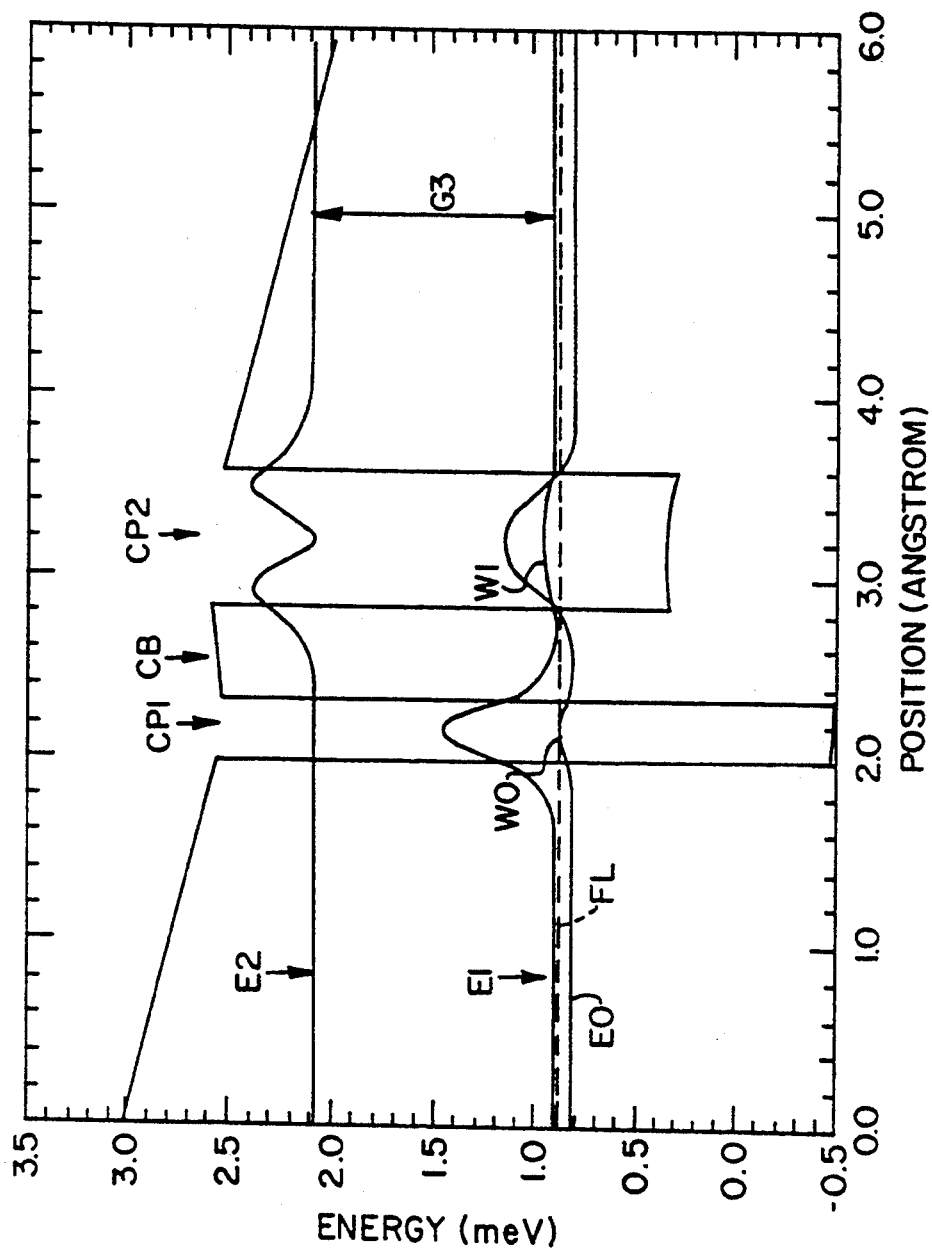

FIGS. 4, 5, and 6 illustrate more precisely the behavior of the two wells. In these Figures the sites of the well CP1, of the barrier CB, and of the well CP2 may be recognized.

In FIGS. 4, 5, and 6, the abscissae represent positions measured in hundreds of angstroms. The ordinates represent energy measured in hundreds of milli-electron-volts and the various wave functions squared so as to be brought up to a probability of presence.

The ground line E0 marks the first level of energy for the electrons; the dotted line FL marks the Fermi level; the reference line E1, the second energy level for electrons, and the reference line E2, the third level of energy for the electrons.

The wave function W0 for electrons of the corresponding level is superimposed on the line E0. In FIG. 4, it may be observed that this wave function has a greater probability of the presence of electrons in the well CP1, marking the presence of electrons in this well.

However, in the presence of the electric field capable of generating an increasing potential W in the structure, the wave function of level E0 comes to be located progressively in the second well, as may be seen in FIGS. 5, then 6. Transitions then become possible in the well CP2 between energies E0 and E2, given the energy jump G3 to which the absorption of a wave having the above-mentioned frequency f3 corresponds.

It should be noted that, for the value of the electric field at which the electrons move from well CP1 to well CP2, the holes remain in the first well. As a result, there is a spatial separation of the electrons in well CP2 and of the holes in well CP1. The effect of this phenomenon is to increase the life-span of the photo-created electron-hole pairs by more than three orders of magnitude (about 1,000). The consequence of this occurrence is that, to obtain an identical quantity of electrons in a stationary process at the level of the quantal well CP2 making absorption possible at the frequency f3, only a wave-pump significantly less powerful than that in conventional techniques (approximately one thousand times less powerful) is needed.

The commutation of the modulation takes place by means of a control through the electric field. The transmission band of this type of modulator is, therefore, limited by the speed with which the electric field is established. For a carrier density on the order of $10^{11}$ to $10^{12}$ electrons per cm$^2$, when the intraband absorption is fairly pronounced, the interaction distances may be slight, typically several microns, a distance which may be compared to the several millimeters required for the modulators based on the Pockels effect.

The specialist will understand that this makes it possible to improve both the transmission band of the modulator and its depth of modulation.

According to a variant embodiment, instead of using a pumping wave, one of the wells is doped; under the effect of the generation of an electric field, operation is identical to that described above.

It should be specified that in this variant embodiment, if the quantal well is CP1 doped, the modulator will normally be transparent (without generation of an electric field).

If the well CP2 is doped, the modulator will normally be opaque for the frequency f3 to be modulated. The structure of the layers of the modulator, according to this variant, will be identical to that shown in FIG. 7.

In this connection, the reader is reminded that the inequality of the forbidden-band energy gaps may be the result not only of their composition, but also of their structure, and in particular of their geometry.

In the preceding discussion, two secondary aspects of the first family of embodiments of the invention have been considered.

In a second family, the frequencies used are associated with interband transitions, i.e., between the conduction band and the valence band.

The wave to be modulated will be a wave having a frequency f1 corresponding to the forbidden band G1, or slightly greater.

If reference is made once again to FIGS. 3 and 4, it will be observed that the absorption of a wave at frequency f1, associated with the forbidden band G1 gap and located in the near-infrared band, may be modulated by a wave having frequency f2, associated with the forbidden-band G2 gap.

Of course, the dual command using a wave-pump having frequency f2 and the electric field is maintained. The advantage of the coupled well thus resides in the increase in life-span of the carriers, i.e., electron-hole pairs. The result is a decrease in the power of the wave-pump, which is required to achieve saturation of the absorption at frequency f1 associated with G1.

If the two wells are identical, modulation at frequency f1 occurs by means of the Stark effect; the advantage of the well system lies in increasing the Stark effect.

There is no single direction in which the wave to be modulated must be applied to the structure. On the other hand, no one will want to apply this wave in any direction whatever. Indeed, for the purpose of intraband transition, the polarization of the light wave must occurs along the axis OZ, while for interband transition, this polarization is forbidden.

According to the embodiment shown in FIG. 7, the wave hV3 to be modulated is inclined in relation to the upper surface of the device. In order for the modulator to function, one of the components of the electric field of the wave to be modulated, must be polarized along an axis parallel to the OZ axis, this OZ axis being the growth axis of the layers Cl1 to Cl2 which make up the modulator. Therefore, one of the components of the wave to be modulated should be positioned along an axis other than the OZ axis.

Figure 8:
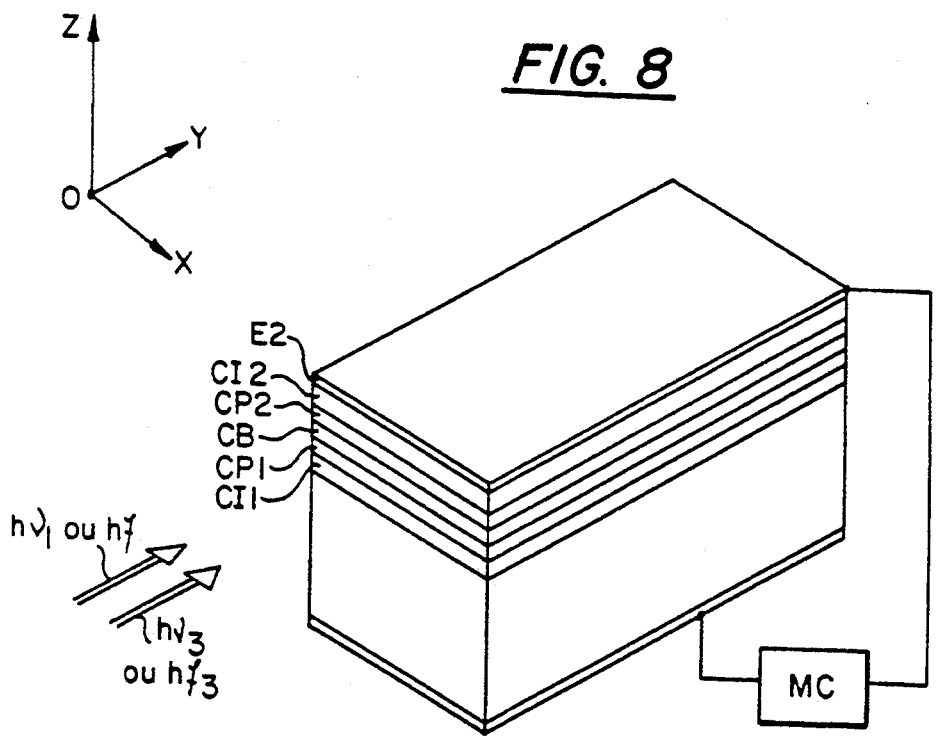
FIG. 8 is a variant embodiment of the modulator in FIG. 6.

As in FIG. 8, the two waves hv1 and hv3 are parallel to the plane of the layers of the modulator, more precisely, parallel to the OY axis.

However, although this is not shown, any other type of orientation of the directions of the waves hv1 and hv3 may be established, either between them or in relation to the plane of the layers Cl1 and Cl2 of the modulator.

In the event that the wave to be modulated or the pumping wave arrives in relation to the upper surface of the modulator, the electrode E2, at least, must be semi-transparent to the wave or waves which pass through it. In this regard, it will be noted that the wave to be modulated may be either free or guided by containment along one dimension, or guided along two dimensions.

Figure 9:
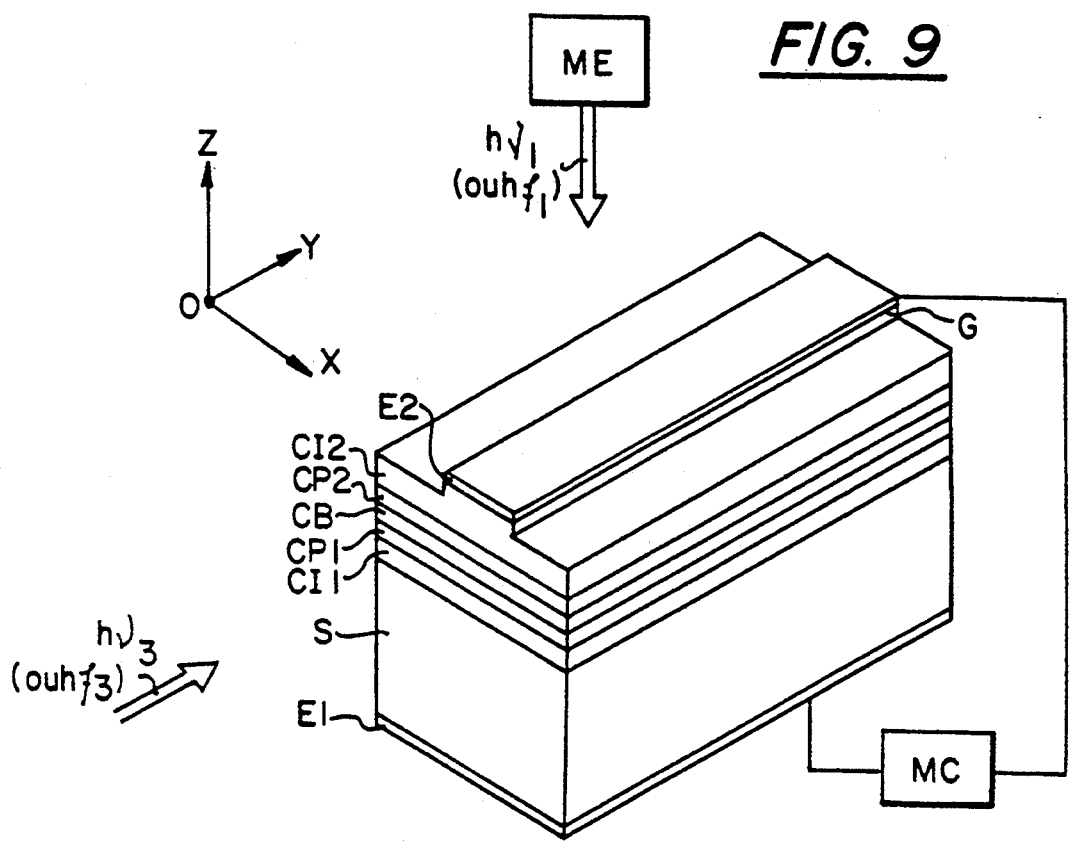
FIG. 9 is an embodiment of the invention modulator functioning as a guided optics apparatus.

FIG. 9 represents an embodiment operating by guidance. The intermediate layer Cl2 has, at the top, a guiding portion G oriented, for example, along the OY axis. The embodiment of this guide is well-known within the technology, and the calculation of a guide having the dimensions required to obtain proper guidance is well known.

In accordance with FIG. 9, the electrode E2 covers only the guidance portion G; however, according to other embodiments, it may also cover the entirety of layer Cl2.

In accordance with the embodiment in FIG. 9, the wave to be modulated is oriented along the OY axis, but it could be oriented differently. The direction of polarization of this wave must be oriented along the axis of growth OZ.

In the preceding discussion, a substrate was chosen having an index of refraction which is preferably lower than the index of the guide.

In the case of operation by means of transmission through the modulator, i.e., of a mode of operation in which the wave to be modulated passes into the modulator through its upper side, it is possible that the substrate has a certain absorptive capacity which could hinder the operation of the device.

Figure 10:
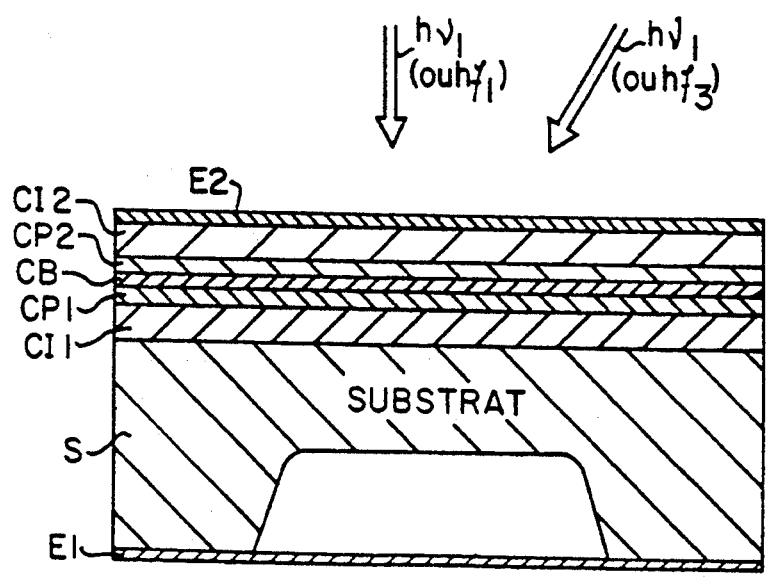
FIG. 10 is a variant embodiment of the modulators in FIGS. 7 to 9.

To limit the effect of this problem, the substrate would be made thinner. As shown, for example, in FIG. 10, a cavity made in the thickness of the substrate reduces the optical path in the substrate material.

In the embodiment examples of FIGS. 7 to 10, modulators are illustrated in which a pumping wave makes possible the populating of the energy level of the first quantal wells CP1 with electrons. This populating with electrons may also be achieved by doping. In this case, the ME pumping-wave source is not useful, and the system remains similar to those shown in the Figures.

The specialist will understand that the effectiveness of modulation may be increased by using a structure in which the pattern of the two quantal wells is repeated several times. In this case, as shown in FIG. 2, the layer CI2 performs the function of layer CI1, and would then be followed by another series CP1, CB, CP2, CI2, and so one, as required.

In accordance with the invention, the invention structure may be applied to the construction of an electromagnetic wave detector.

Figure 11:
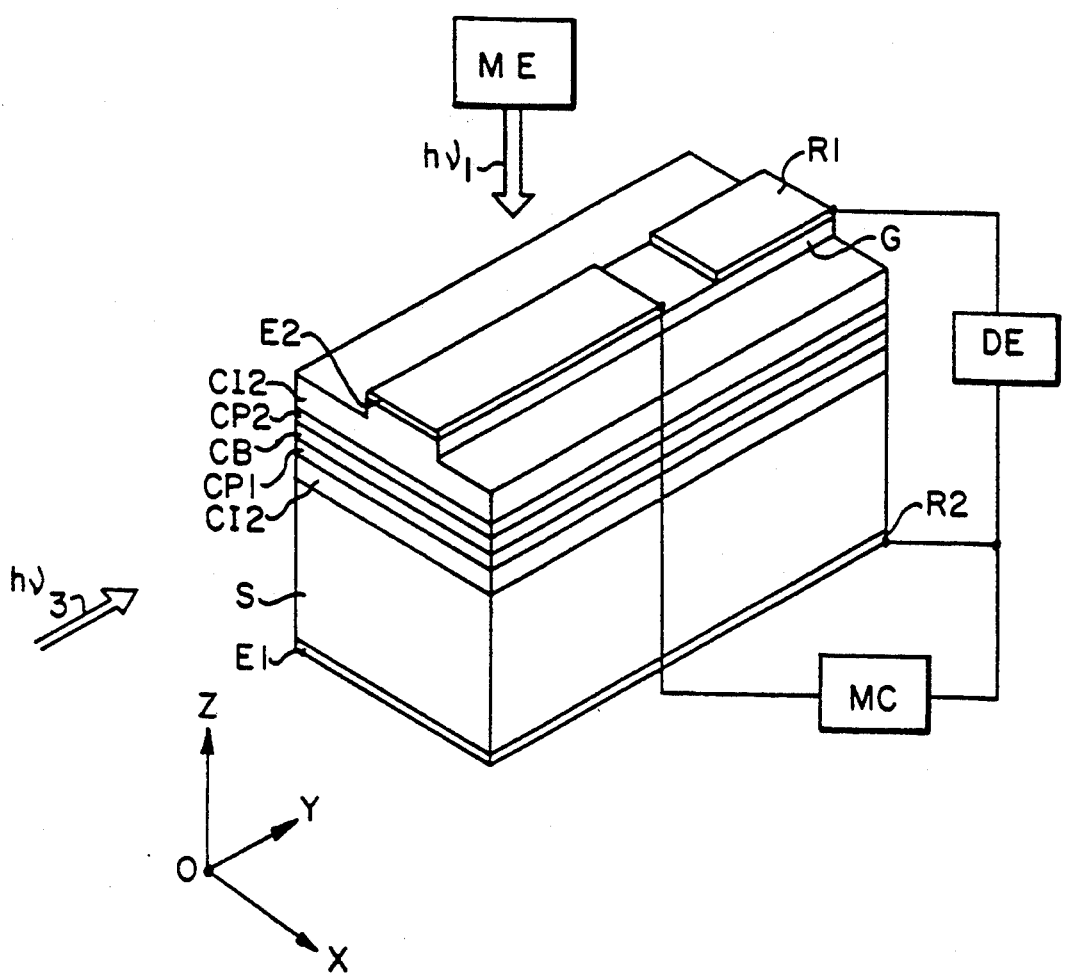
FIG. 11 is an embodiment of an optical detector according to the invention.

In this case, ohmic contacts R1, R2 are provided on the external layers of the device, as shown in FIG. 11.

A current detector DE is, in this case, connected to the ohmic contacts, enabling the invention device to act as an electromagnetic wave detector.

This device may then be used as an apparatus for the recognition of images by making it possible for the pump wave and the wave to be modulated to perform the "AND" function. For the purpose of optical guidance, the integration of a modulator and an infrared detector on the same semi-conducting structure may be contemplated; this arrangement may hold an advantage for certain applications.

FIG. 11 represents one embodiment of a detector of this kind. As an example, a detector operating in the guided mode is shown. The electrode covers only a portion of the guide.

An ohmic contact R1 is provided on another part of the guide. An additional ohmic contact R2 is also installed on the free surface of the substrate S. A DE detector is connected between the two ohmic contacts R1 and R2, and makes possible the detection of a current created by the passage of an h 3 wave.

In accordance with the detector in FIG. 11, it is possible to make the electrode E1 and the ohmic contact R2 of one piece; one of the terminals of the detector Me and of the generator MC are, in this arrangement, electrically connected.

The detector shown in FIG. 11 operates in the guided optics mode. It may also operate in a non-guided optic modes, by adapting the modulator in FIG. 7 by providing at least one ohmic contact R1 on the surface of layer CI2. This detector may then serve as an image detector, by illuminating the upper surface of lay CI2 using a pump wave (hν1) and a wave to be modulated. Each wave transmits an image, and the detector then makes it possible to identify them.

Finally, the detector maybe made by making use of the variant embodiment of the invention, in which the populating with electrons of the outer energy level of the first quantal well is obtained by means of doping. Therefore, the source ME is no longer useful. The detector operates by detecting a fixed level of the wave to be modulated.

Of course, the present invention is not limited to the embodiments described, but rather covers all variants included within the framework of the following claims.

We claim:

1. An electromagnetic wave modulator, comprising:
   a semi-conducting structure containing a first alternating arrangement of layers making up a first quantal well;
   means for populating the first discrete energy level of the first quantal well with electrons; and
   means for controlling the absorption of a wave to be modulated by the quantal well,
   wherein said semi-conducting structure incorporates another alternating arrangement of layers in proximity to the first set of alternating layers and delimiting a second quantal well, which is coupled to the first quantal well across a barrier layer, and wherein said means of control contain means for applying upon command to said structure an electric field perpendicular to said barrier, thereby permitting an increase in the life-span of the electron-hole pairs thus created, and wherein the compositions of the quantal wells are such that the first well allows a single discrete level of energy, while the second well allows two levels of energy whose differential corresponds to the frequency to be modulated multiplied by Planck's constant.

2. Modulator according to claim 1, wherein the wave to be modulated is a wave having a frequency $f3 = Ge/h$, G3 being an energy-level differential in one of the quantal wells and h being Planck's constant, the wave to be modulated being subjected to intraband absorption between a first and second level of energy located on the same side of the forbidden band of said quantal well.

3. Modulator according to claim 1, wherein the compositions of the energy wells are such that the first well allows two levels of energy whose differential is greater than or equal to the product ($G3 = f3h$) of the frequency to be modulated by Planck's constant (h), while the second well allows two levels of energy whose differential is greater than or equal to the product ($G3 = f3h$) of the frequency to be modulated by Planck's constant (h).

4. Modulator according to claim 2, wherein the thickness and composition of the layers are such that the second quantal well possesses a forbidden-band energy gap which is greater than that of the first.

5. Modulator according to claim 4, wherein the means for populating with electrons apply to the semi-conducting structure a wave-pump suitable for populating a level of energy of one of the quantal wells, for example with electron-hole pairs, while the application of the electric field transfers electrons from said quantal well to the other quantal well (CP2), said intraband absorption occurring in said second quantal well.

6. Modulator according to claim 5, wherein the means for energy population are actuated upon command and are combined with means of control to make possible an "AND" function.

7. Modulator according to claim 4, wherein the means for electron population of one of the quantal wells include doping of the active layer of this well.

8. Modulator according to claim 7, wherein the doped well is the first well, the modulator being normally transparent to the wave to be modulated.

9. Modulator according to claim 4, wherein the doped well is the second well, the modulator being normally opaque to the wave to be modulated.

10. Modulator according to claim 1, wherein the wave to be modulated is a wave having a frequency $f1=G1/h$ and is subjected to interband absorption between two energy levels located on either side of the forbidden band of one of the quantal wells.

11. Modulator according to claim 10, wherein the second quantal well possesses a forbidden-band energy gap different from or equal to that of the first.

12. Modulator according to any of claims 12 and 4-12, wherein it operates in the near-infrared range.

13. Modulator according to any of the preceding claims, wherein it receives a wave to be modulated which is guided along one or two dimensions.

14. Modulator according to any of the preceding claims, wherein the pattern of two quantal wells is repeated several times.

15. Modulator according to claim 2, wherein the length of the wave to be modulated applied to the modulator has a value at least equal to Planck's constant (h) divided by the energy-level differential.

16. Modulator according to claim 10, wherein the length of the wave to be modulated applied to the modulator has a value at least equal to Planck's constant (h) divided by the width of the forbidden band of the second well.

17. Electromagnetic wave detector using the modulator according to any of the preceding claims, wherein it incorporates ohmic contacts on the outer surfaces of the device on either side of the quantal wells, as well as a current detector connected to these ohmic contacts.

* * * * *